United States Patent
Rock et al.

[11] Patent Number: 5,878,808
[45] Date of Patent: Mar. 9, 1999

[54] ROTATING HEAT EXCHANGER

[75] Inventors: Edward Thomas Rock, Chesterfield; Lawrence Thomas Shafer, St. Peters, both of Mo.

[73] Assignee: McDonnell Douglas

[21] Appl. No.: 739,946

[22] Filed: Oct. 30, 1996

[51] Int. Cl.⁶ ................................................. F28D 11/02
[52] U.S. Cl. ...................... 165/85; 165/86; 165/104.25; 415/73; 416/177
[58] Field of Search ..................... 165/85, 86, 104.25; 415/71, 73, 75; 416/176, 177

[56]  References Cited

U.S. PATENT DOCUMENTS

| | | | |
|---|---|---|---|
| 1,843,088 | 1/1932 | Minnard | 415/71 X |
| 2,044,532 | 6/1936 | Kessel | 415/71 |
| 2,801,829 | 8/1957 | Taylor | 257/124 |
| 2,975,959 | 3/1961 | Foster | 165/86 X |
| 3,001,384 | 9/1961 | Hanson et al. | 62/499 |
| 3,621,908 | 11/1971 | Pravda | 165/86 |
| 3,696,634 | 10/1972 | Ludin et al. | 62/333 |
| 3,797,270 | 3/1974 | Laing et al. | 62/333 |
| 3,811,495 | 5/1974 | Laing | 165/85 |
| 3,877,515 | 4/1975 | Laing | 165/86 |
| 3,888,302 | 6/1975 | Laing | 165/86 |
| 3,948,061 | 4/1976 | Kidwell | 62/499 |
| 3,973,622 | 8/1976 | Laing | 165/86 |
| 3,999,400 | 12/1976 | Gray | 62/115 |
| 4,000,778 | 1/1977 | Laing | 165/86 |
| 4,600,050 | 7/1986 | Noren | 165/104.14 |
| 4,674,704 | 6/1987 | Altoz et al. | 244/1 R |

*Primary Examiner*—Allen Flanigan
*Attorney, Agent, or Firm*—Dale B. Halling

[57]  ABSTRACT

A rotating heat exchanger (10) has a first air turbine (16) connected to a first end of an axle (20). The second end of the axle (20) is connected to a second air turbine (18). A heat pipe (30, 40, 42, 44) extends from the first air turbine (16) to the second air turbine (18).

18 Claims, 3 Drawing Sheets

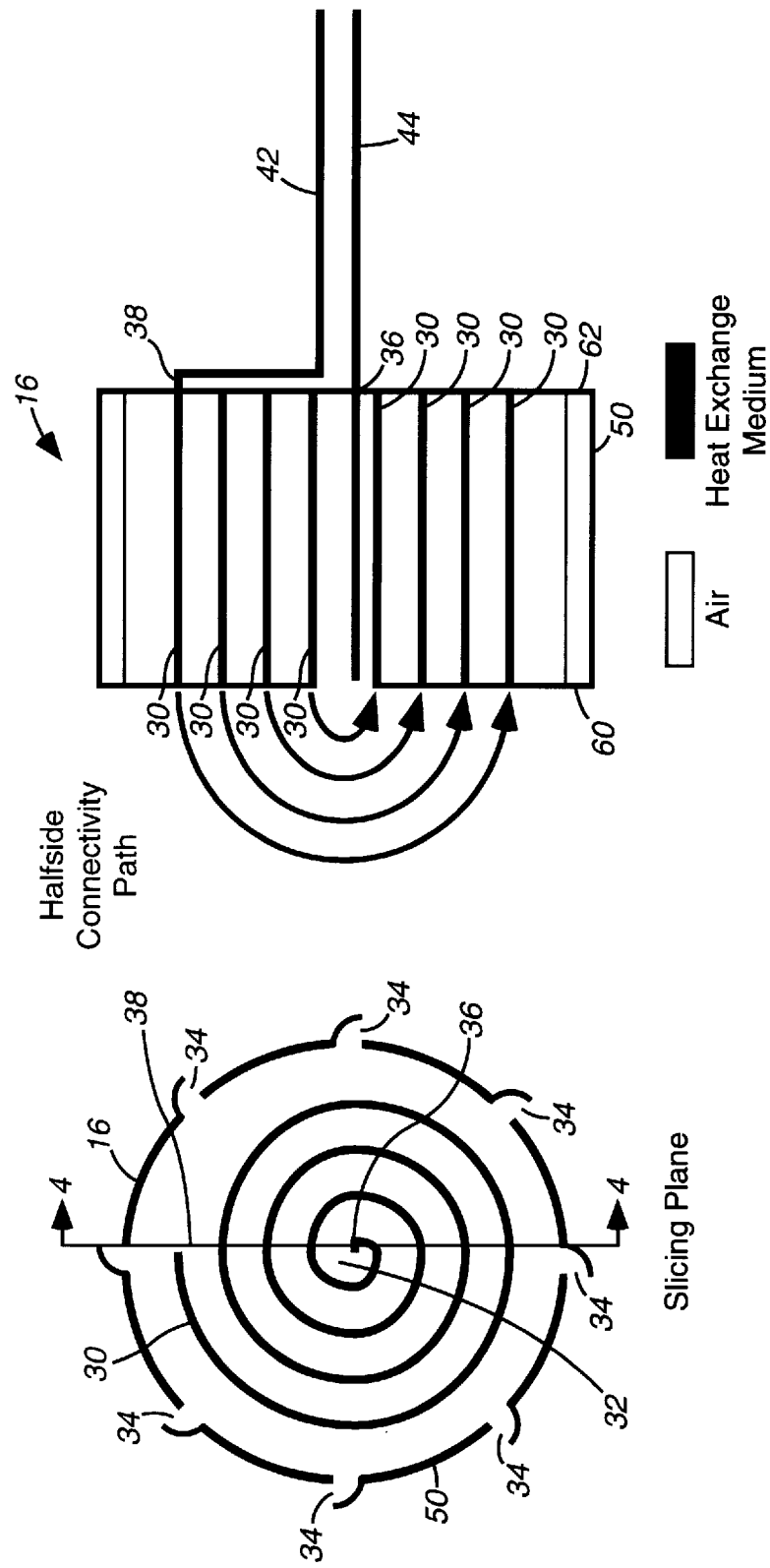

ROTATING HEAT EXCHANGER

FIELD OF THE INVENTION

The present invention relates to the field of heat exchangers and more particularly to a rotating heat exchanger.

BACKGROUND OF THE INVENTION

Using commercial-off-the-shelf electronics in military fighters saves money, however commercial electronics have a limited operating temperature range. As a result it is necessary to provide an active cooling system to use commercial electronics in the military fighter environment. Present heat exchangers used in military fighters use a pump to move a heat exchange medium through a heat pipe. The heat pipe allows the heat exchange medium to remove heat from the hermetically sealed electronic compartment to a cool air source. An electric fan is used in the sealed electronic compartment to circulate the cool air from the heat pipe. Unfortunately, the pump and fan require additional power and add weight that decrease performance and increase the costs of a fighter aircraft. In addition, the fan and the pump are subject to failure and therefore increase the maintenance burden for ground crews.

Thus there exists a need for a heat exchanger that does not require additional power and is not subject to failure.

SUMMARY OF THE INVENTION

A rotating heat exchanger that overcomes these and other problems has a first air turbine connected to a first end of an axle. The second end of the axle is connected to a second air turbine. A heat pipe extends from the first air turbine to the second air turbine.

BRIEF DESCRIPTION OF THE DRAWINGS

FIG. 3 is a cross section of a side view of an air turbine used in the rotating heat exchanger; and FIG. 4 is a cross section along the 4—4 line of the air turbine in FIG. 3.

DETAILED DESCRIPTION OF THE DRAWINGS

Figure 1:
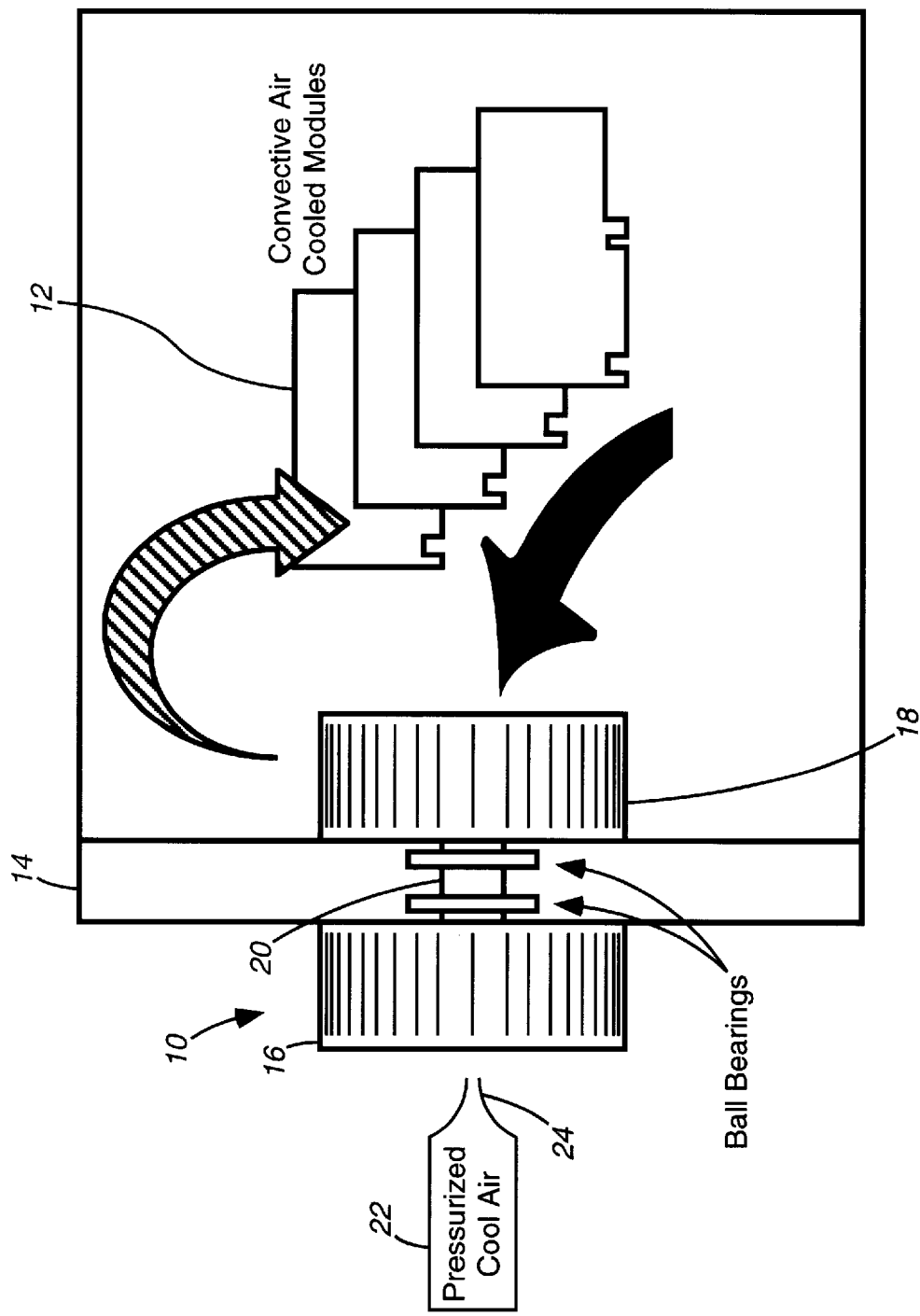
FIG. 1 is a schematic diagram of a rotating heat exchanger according to the invention.

FIG. 1 is a schematic diagram of a rotating heat exchanger 10, according to the invention, in a fighter aircraft. The commercial off the shelf electronic boards 12 generate heat inside a hermetically sealed electronics compartment that requires dissipation. The rotating heat exchanger 10 dissipates the heat generated by the electronics 12. The rotating heat exchanger 10 extends through a wall 14 in the electronics compartment. The rotating heat exchanger 10 comprises a first air turbine (drive air turbine) 16, a second air turbine (driven air turbine) 18 and an axle 20. The axle 20 connects the first air turbine 16 to the second air turbine 18. A plurality of ball bearings around the axle 20 allow the air turbines 16, 18 to rotate freely. A pressurized cool air source (pressurized air source) 22 has an output air stream 24 that drives the first air turbine 16. The pressurized air source 22 in one embodiment is provided by the environmental control system of the aircraft. The environmental control system provides cooling for the cockpit. In the event the environmental control system fails pressurized air can be provided by the pitot static pressure from an exterior port of the aircraft while it is in flight.

Figure 2:
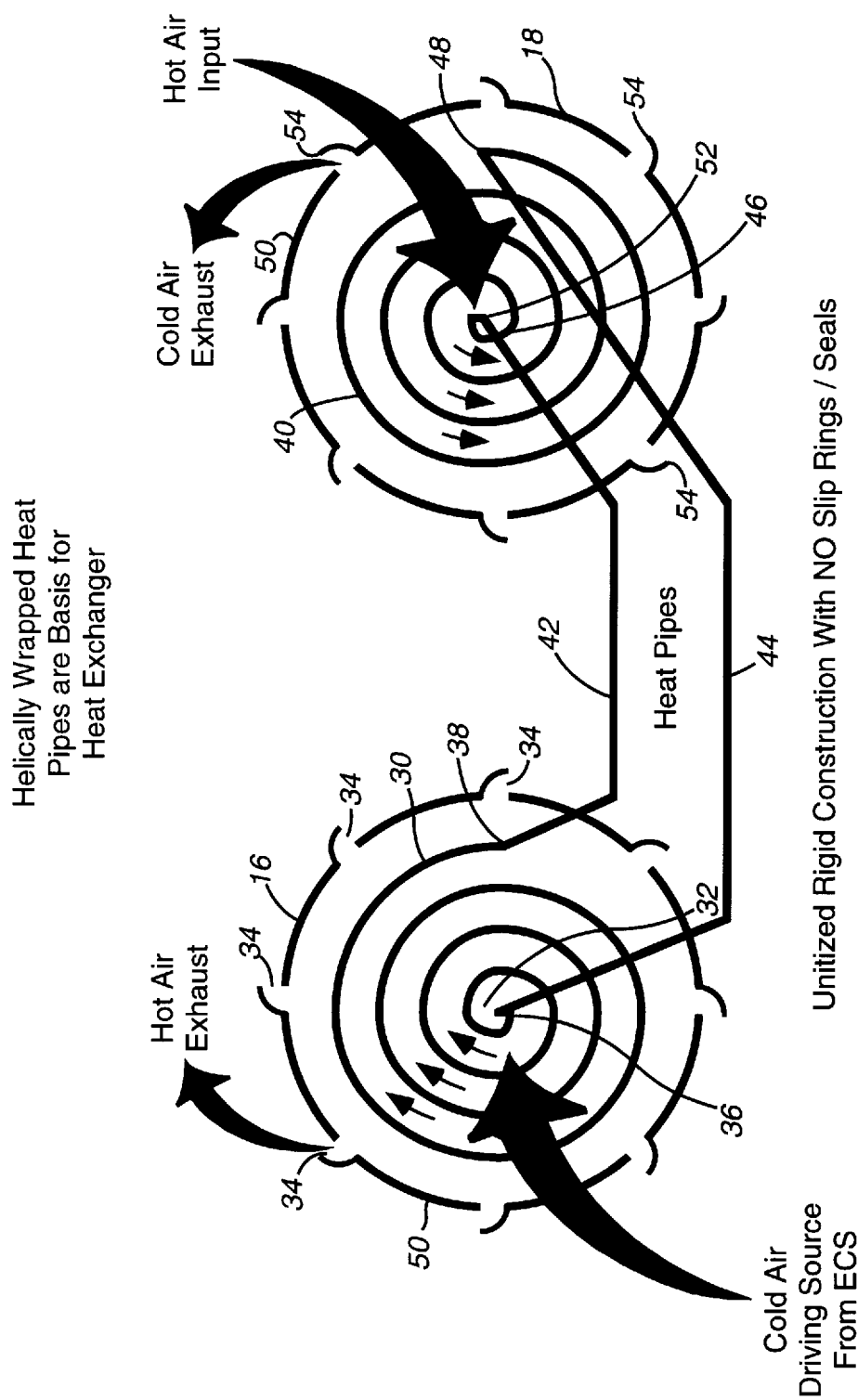
FIG. 2 is a schematic diagram of the helical heat pipes used in the rotating heat exchanger.

FIG. 2 is a schematic diagram of the helical heat pipes. A first helical heat pipe (first part, helically wrapped heat pipe, drive spiral heat pipe) 30 is contained in the first air turbine 16. The pressurized cool air source 22 provides a cool air stream in the center (rotational axis) 32 of the first helical heat pipe 30. As the air is pushed through the helical heat pipe 30 and out of the exhaust ports 34, the air causes the first turbine 16 to rotate. The rotation of the first air turbine 16 causes the axle 20 and the second air turbine 18 to rotate. In addition, as the cool air travels through the helical heat pipe 30 it extracts heat from a heat exchange medium contained in the helical heat pipe 30. The heat in the air is then exhausted through the exhaust ports 34. The heat exchange medium is any well known heat exchange medium and is selected based on the particular requirements of the situation. In one embodiment the heat exchanger medium is a combination of alcohol and water.

The first helical heat pipe 30 is attached to the sides of the first air turbine 16. The second helical heat pipe (second part, driven spiral heat pipe) 40 is inside and attached to the sides the second air turbine 18. The heat exchange medium circulates from an input 36 of the first helical heat pipe 30 to an output 38 of the first helical heat pipe 30. The heat exchanger medium flows from the output 38 of the first heat pipe 30 through one of a pair of connecting heat pipes 42, 44 to an input 46 of the second helical heat pipe 40. The heat exchange medium flows from the input 46 to an output 48 of the second helical heat pipe 40 and then through a second of the pair of connecting heat pipes 42, 44 to the input 36 of first helical heat pipe 30. The circulation of the heat exchange medium is caused by the heat exchange medium expanding due to heating in the second helical heat pipe 40. This results in less mass of the heat exchange medium being in the second helical heat pipe 40 than in the first helical heat pipe 30. This convective circulation is augmented by the centrifugal force that pushes the heat exchange medium toward a periphery 50 of the helical heat pipes. Because the centrifugal force is greater, due to the extra mass (greater mass) of heat exchanger medium, in the first helical heat pipe 30 the heat exchanger medium flows from the output 38 to the input 46 of the second helical heat pipe 40.

Hot air from the electronics 12 is drawn into the rotational axis 52 of the second air turbine 18, forced around the second helical heat pipe 40 and out the exhaust vents 54. As the air travels along the second helical heat pipe 40, it is cooled. This increases the density of the air and the centrifugal force pushes the air out of the second air turbine 18.

FIG. 3 is a cross section of one of the air turbines. Since both the air turbines are identical, the reference numerals will refer to the first air turbine 16. By taking a cross section along the 4—4 line the cross section of the first air turbine 16 is shown in FIG. 4. As shown in FIG. 4 the first helical heat pipe 30 connects to the side walls 60, 62 of the first air turbine 16. The input 36 connects to one of the pair of connecting heat pipes 44 near the side wall 62. The output 38 of the first helical heat pipe 30 has an "L" connection to the second connecting heat pipe 42. The axle 20 encloses the pair of connecting heat pipes 42, 44 and the axle 20 is hermetically sealed from the airstream 24. This prevents the potentially contaminated exterior air from entering the electronics compartment. The complete environmental isolation between the exterior air and the electronics compartment is a requirement for military aircraft. The first end of the axle 20 connects to side wall 62 of the first air turbine 16 and a second end of the axle 20 connects to a side wall of the second air turbine 18. The axle 20 has an access for the "L" connection. The second air turbine 18 is a mirror image of the first air turbine 16.

The rotating heat exchanger 10 described herein does not require pumps or fans. As a result it save weight and power over the prior art heat exchangers. Since the rotating heat exchanger 10 does not have any pumps or fans its reliability is limited only by the ball bearings. The pressurized air source 22 already exists in a fighter aircraft and the rotating heat exchanger only requires that an output airstream 24 be provided at the air input of the first air turbine 16. Thus there has been described a rotating heat exchanger 10 that is highly reliable, does not require power and is lighter than previous heat exchanger designs.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A rotating heat exchanger comprising:

a first air turbine;

a first helical heat pipe attached to a pair of sides of the first air turbine, the first air turbine only containing a single heat pipe;

an axle having a first end connected to the first air turbine;

a second air turbine connected to a second end of the axle; and a connecting heat pipe extending from the first air turbine to the second air turbine and attached to the first helical heat pipe.

2. The rotating heat exchanger of claim 1, wherein the first helical heat pipe has an input near a rotational axis of the first air turbine and an output neat a periphery of the first air turbine.

3. The rotating heat exchanger of claim 2, further including a heat exchange medium contained in the heat pipe.

4. The rotating heat exchanger of claim 3, wherein the heat exchange medium is forced from the input of the first part to the output by centrifugal force.

5. The rotating heat exchanger of claim 1, wherein the second air turbine contains a second helical heat pipe attached to the sides of the second air turbine.

6. The rotating heat exchanger of claim 5, wherein the second helical heat pipe has an input connected to an output of the first helical heat pipe.

7. The rotating heat exchanger of claim 1, wherein the axle is hermetically sealed.

8. The rotating heat exchanger of claim 1, wherein the first air turbine and the second air turbine are separated by a wall.

9. A heat exchanger comprising:

a first helical heat pipe having an input and an output, the first helical heat pipe having a center;

a pressurized cool air source connected to the center of the first helical heat pipe and causing the first helical heat pipe to rotate, said first helical heat pipe designed so that the action of the pressurized cool air source on the first helical heat pipe results in rotation of the first helical heat pipe;

a second helical heat pipe having an input connected to the output of the first helical heat pipe and an output connected to the input of the first helical heat pipe; and an axle connecting the first helical heat pipe to the second helical heat pipe.

10. The heat exchanger of claim 9, wherein the axle is hermetically sealed.

11. The heat exchanger of claim 9, further including a heat exchanger medium in the first helical heat pipe.

12. The heat exchanger of claim 11, wherein the heat exchanger medium is forced from the input of the first helical heat pipe to the output by centrifugal force.

13. The heat exchanger of claim 12, wherein the heat exchanger medium in the first helical heat pipe has a greater mass than in the second helical heat pipe.

14. The heat exchanger of claim 9, further including a first air turbine covering the first helical heat pipe.

15. The heat exchanger of claim 9, further including a second air turbine enclosing the second helical heat pipe.

16. A rotating heat exchanger comprising, a pressurized cool air source;

a drive air turbine having an air input coupled to the pressurized air source;

a drive spiral heat pipe inside the drive turbine having an input drive and an output, the pressurized cool air source connected to a center of the drive spiral heat pipe and the drive air turbine rotating as an air from the pressurized cool air source is forced through the drive spiral heat pipe, said drive spiral heat pipe designed so that the action of the pressurized cool air source on the drive spiral heat pipe results in rotation of the drive spiral heat pipe;

an axle connected to a side of the drive air turbine;

a pair of connecting heat pipes contained in the axle, one of the pair of connecting heat pipes coupled to the input of the drive spiral heat pipe and a second of the pair of connecting heat pipes coupled to the output of the drive spiral heat pipe;

a driven air turbine having a side connected to the axle; and a driven spiral heat pipe inside the driven turbine having an input coupled to the second of the pair of connecting heat pipes and an output coupled to the one of the pair of connecting heat pipes.

17. The rotating heat exchanger of claim 16, further including a heat exchange medium in the drive spiral heat pipe and the driven spiral heat pipe.

18. The rotating heat exchanger of claim 16, wherein the axle is hermetically sealed.

* * * * *